United States Patent
Kunze

(10) Patent No.: US 10,044,348 B2
(45) Date of Patent: Aug. 7, 2018

(54) METHOD FOR OPERATING A FIELD DEVICE AND CORRESPONDING FIELD DEVICE

(71) Applicant: KROHNE Messtechnik GmbH, Duisburg (DE)

(72) Inventor: Johannes Kunze, Bochum (DE)

(73) Assignee: KROHNE Messtechnik GmbH, Duisburg (DE)

(*) Notice: Subject to any disclaimer, the term of this patent is extended or adjusted under 35 U.S.C. 154(b) by 16 days.

(21) Appl. No.: 15/086,301

(22) Filed: Mar. 31, 2016

(65) Prior Publication Data

US 2016/0294375 A1    Oct. 6, 2016

(30) Foreign Application Priority Data

Apr. 1, 2015   (DE) ................. 10 2015 105 090

(51) Int. Cl.
| | |
|---|---|
| *H03K 5/153* | (2006.01) |
| *H03K 5/24* | (2006.01) |
| *G05B 19/042* | (2006.01) |
| *G05B 23/02* | (2006.01) |
| *H03M 1/06* | (2006.01) |

(52) U.S. Cl.
CPC ......... *H03K 5/24* (2013.01); *G05B 19/0423* (2013.01); *G05B 23/024* (2013.01); *H03M 1/0626* (2013.01)

(58) Field of Classification Search
CPC .. H03K 3/02337; H03K 5/086; H03K 3/3565; G01R 19/16542; G01R 19/16552

USPC ........................................... 327/72, 73
See application file for complete search history.

(56) References Cited

U.S. PATENT DOCUMENTS

| | | | |
|---|---|---|---|
| 6,466,893 B1 | 10/2002 | Latwesen | |
| 6,557,131 B1 * | 4/2003 | Arabi | H03M 1/109 714/733 |
| 7,280,048 B2 | 10/2007 | Longsdorf et al. | |
| 2002/0082799 A1 | 6/2002 | Pramanik | |
| 2008/0191732 A1 * | 8/2008 | Pelgrom | G01R 19/28 324/750.3 |
| 2009/0296254 A1 * | 12/2009 | Hayashi | G11B 19/048 360/31 |
| 2010/0103003 A1 * | 4/2010 | Deval | H03M 3/33 341/118 |
| 2013/0090077 A1 * | 4/2013 | Rozenblit | H04W 52/52 455/127.2 |
| 2015/0061904 A1 * | 3/2015 | Lee | H03M 1/1023 341/118 |

(Continued)

FOREIGN PATENT DOCUMENTS

| | | | |
|---|---|---|---|
| WO | 01/11436 A1 | 2/2001 | |
| WO | WO 2010037687 A2 * | 4/2010 | ............... G01D 3/08 |

*Primary Examiner* — Quan Tra
(74) *Attorney, Agent, or Firm* — David S. Safran

(57) ABSTRACT

A method for operating a field device, and a field device that is operated according to the method, in which a measured value is generated, the measured value being assigned a current set point, a target current signal being issued depending on the current set point, wherein an actual current signal is fed back and the target current signal is compared to the actual current signal. To provide more exact comparison of signals a cross-correlation of the target current signal with the actual current signal is formed for comparison.

11 Claims, 3 Drawing Sheets

(56) References Cited

U.S. PATENT DOCUMENTS

2016/0180773 A1\* 6/2016 Lim .................... G09G 3/3233
345/212

\* cited by examiner

METHOD FOR OPERATING A FIELD DEVICE AND CORRESPONDING FIELD DEVICE

BACKGROUND OF THE INVENTION

Field of the Invention

The invention relates to a method for operating a field device, wherein a measured value is assigned a current set point. A target current signal is issued depending on the current set point. An actual current signal is fed back and the target current signal is compared to the actual current signal. Furthermore, the invention relates to a field device having at least one signal outlet and at least one control component. The field device generates a measured value and the control component assigns the measured value a current set point. The control component generates a target current signal depending on the current set point. The target current signal is issued via the signal outlet and the control component feeds back an actual current signal. The control component compares the target current signal to the actual current signal.

Description of Related Art

In the field of modern process automation, field devices are often used for monitoring process variables and actuators are used for influencing processes. In the case that the field devices are measuring instruments for measuring fill levels, flow, temperatures or pH values, these signals issued from the field device correspond to the obtained measured values. Signals, which give information about the state of the field device, for example, error signals, are issued via optional special outlets.

Conventionally, the standard of 4 . . . 20 mA signals is used for signaling. Thereby, field devices are connected to a higher-level unit via 4 . . . 20 mA current loops (standard signal) or are attached to regulators and controllers having such a standard signal outlet. In addition to signal transmission, these current signals are used in 2-wire technology for energy supply of the field device. For the assignment of signals, the two limiting values 4 mA and 20 mA are usually assigned to the smallest or largest expected measured value. For the measured values between them, linear assignment is usually carried out. In the case of an error recognized in the field device, current values outside the range between 4 mA and 20 mA are issued as a standard.

It is problematic when the field device issues a value between 4 . . . 20 mA, but this value does not correspond to the set value that was assigned to the corresponding measured value.

To this end, it is known from the prior art that a current signal issued by the field device is fed back and compared to the set current value.

For example, German DE 199 30 661 A1 and corresponding U.S. Patent Application Publication 2002/0082799 A1 show a measuring transducer having a computing unit. A signal detected by a sensor is initially digitized and then fed to the computing unit. The computing unit processes the detected signal into a target value. The target value is then converted into an analog signal and issued via a signal outlet. This analog signal is fed back and transmitted again to the computing unit in digitized form. The computing unit determines a deviation between the target value and the output signal.

In the field of transmission protocols, for example, signals are superimposed with other signals or filtered and can only be compared to the originally issued signal with great effort.

One example is the widely-known HART communication. HART (Highway Addressable Remote Transducer) is a protocol for field devices having a bus address. It is one variation of digital field communication that contains many functions of field buses. In HART communication, field devices are conventionally connected using the 4 . . . 20 mA standard and joined to a higher-level unit. A digital signal is modulated onto the analog 4 . . . 20 mA signal using the FSK (Frequency Shift Keying) method. Thus, measurement, position and device data can be additionally transmitted without influencing the analog signal. Additionally, a comprehensive integration of the field device into the process control system is made possible using the HART protocol.

In the known HART standard, in which a low-frequency, analog signal is superimposed with high-frequency signals, it is common that an analog low pass filter is used for band limitation. Thus, higher frequencies of the 4 . . . 20 mA signal are filtered out. In the case that unfiltered signals are superimposed with a high-frequency signal according to the HART standard, it is difficult to differentiate higher frequencies of a broad frequency spectrum from the high-frequency superimpositions. By using an analog low pass filter, communication is simplified on the whole.

If the signal is now fed back, the superimposed signal has to possibly be removed by a digital filter. By converting the analog signal into a digital signal and due to the analog filter, time lags occur between the signals to be compared, which need to be taken into consideration when comparing the signals.

SUMMARY OF THE INVENTION

Thus, the object of the invention is to provide a method for operating a field device—and a corresponding field device—which allows for reliable signal output, in particular when using the HART protocol.

The method according to the invention, in which the above derived and described object is achieved, is initially and essentially wherein a cross-correlation of the target current signal with the actual current signal is formed for comparison. Signals, even if they have a time lag, are easily and precisely comparable due to the cross-correlation.

Cross-correlation is defined as the integral over the time of two time functions $x(t)$ and $y(t)$ multiplied with one another, wherein one of the functions is time shifted to the other at a set value $\tau$. If both functions are essentially the same, but only time-shifted by a value $\tau_1$, then the correlation function has a maximum for $\tau=\tau_1$.

In practice, signals are not provided as mathematical functions, but as discrete time signals, i.e., values $x_i$, $y_i$ at discrete points in time $i=1 \ldots N$. Thus, it is possible to represent the transition of the integral in a sum (i corresponds to t and k corresponds to $\tau$). If the result is divided by the effective value of the individual signals, this is said to be a standardized cross-correlation:

$$\mathrm{corr}(k) = \frac{\sum_{i=1}^{N} x(i) \cdot y(i+k)}{\sqrt{\sum_{i=1}^{N} (x(i))^2 \cdot \sum_{i=1}^{N} (y(i+k))^2}}$$

If the signals are the same for one k, the standardized cross-correlation yields the value 1. If the signals are out of phase, it yields the value −1. Signals are said to be uncorrelated when the value of the standardized correlation is equal to zero for all k.

Cross-correlation is used for evaluating and comparing the issued and fed-back signals in the method according to the invention for operating a field device. Thus, it is possible to compare signals that are possibly shifted to one another due to time lag caused by conversion, filtering or other measures. Furthermore, signals that are not identical or are not similar are compared effectively, so that the result of cross-correlation indicates whether or not a target current signal corresponds to an actual current signal.

Thus, in this method, it is possible that signals are superimposed on other signals such as, for example, signals according to the HART communication protocol. Even when HART signals are subsequently filtered out for an accurate signal comparison, cross-correlation allows signals having a time lag to one another, which are the cause of such filtering, to be compensated.

In one design of the method according to the invention, it is provided that an auto-correlation of the target current signal or of the actual current signal is formed and that a deviation e of the correlated signals is calculated, wherein the values of the cross-correlation of the actual current signal with the target current signal are put in relation to the value of the auto-correlation of the current set point or the value of the auto-correlation of the actual current signal.

An auto-correlation of a function or a signal is obtained when a signal, as described above, correlates with itself. The auto-correlation is a sort of self-analysis of a signal and can, for example, be used to find periodicities in the signal.

In this design of the invention, a relative deviation of the target current signal from the actual current signal is consequently determined. Thereby, a choice can be made between the auto-correlation of the target current signal and the auto-correlation of the actual current signal. The result of the cross correlation is put in relation to the result of the auto-correlation of the target current signal or of the actual current signal. The closer the result of the division is to the value 1, the more similar, consequently, the target current signal and the actual current signal. Principally, the ratio does not have to be limited to a auto-correlation of the actual current signal or the target current signal.

Analysis by the applicant has shown that the method by calculating the correlation itself even operates reliably when there are large transients in the flow of current, for example from current surges.

Other events or conditions can be linked to the determined deviation e. It is possible that the deviation e is not allowed to fall below a first set limiting value and a second set limiting value is not allowed to be exceeded. When the limit is exceeded, an alarm can be issued and/or an adaptation of a signal can take place. An alarm can be issued in a noticeable optic and/or acoustic and/or haptic form.

In a further design of the method according to the invention, it is provided that the target current signal is digitized with a first sampling rate and the actual current signal is digitized with a second sampling rate that is set at a fixed relation to the first sampling rate. In one design of the invention, this relation can also be chosen to be equal to 1, i.e., the sampling rates are the same. In order to simplify the comparison of the signals, it is advantageous when they are sampled at frequencies that are in a fixed ratio to one another. Both the cross-correlation as well as the auto-correlation only have to be calculated using a low number of sampling values, whereby the computing effort per comparison is reduced.

The above derived and described object is achieved with the field device mentioned in the introduction according to another teaching of the invention in that the control component forms a cross-correlation of the target current signal with the actual current signal for comparison.

The field device is, in particular, an actuator or a measuring device. The following explanations of the designs of a field device according to the invention are correspondingly also valid for the method that has already been described.

It is provided in one design of the field device according to the invention that a converting device is provided for converting digital signals into analog signals, in particular a digital-analog converter or a device for pulse width modulation, and that an analog filter, preferably a low pass filter having a cutoff frequency less than or equal to 25 Hz is connected behind the converting device. Both the converting device as well as the analog filter are connected before the signal outlet.

When the target current signal is generated by the control component, it is subsequently implemented as an analog signal and then filtered with the low pass filter before it is issued via the signal outlet. After the low pass filter, other signals can be superimposed on the analog signal. Superimposing according to the HART standard, for example, is possible, so that the signal is equipped with further information. This process is, of course, not limited to HART communication.

According to a further design of the field device according to the invention, it is provided that an analog-digital converter is provided that digitizes the actual current signal that has been fed back.

In order to make the actual current signal that has been fed back processable for the control component, the signal is digitized. Thereby, depending on the design, feedback is carried out directly behind the signal outlet or, however, at a different position that the signal passes. After digitization, depending on the design, further components that correspondingly process the signal are introduced. Thus, a digital filter can be used to filter out possibly present HART signals. FIR (Finite Impulse Response) filters can be used for this.

In one design of the field device according to the invention, a digital filter is used for filtering out the high-frequency superimpositions of a present HART signal. In the previous digitization, the sampling rate of the actual current signal has a higher frequency than the sampling rate of the target current signal. Advantageously, the high-frequency signal portions are detected in higher sampling rates and these are subsequently digitally filtered out. At lower sampling rates, the information of the high-frequency signals is lost.

In a further design of the field device according to the invention, it is provided that a digital filter is provided as functional replication of the analog filter, which is downstream from the converting device, wherein the digital filter filters the digitized target current signal.

The target current signal is adjusted to the actual current signal by the digital low pass filter. A time lag, which is caused by additional filters, is later compensated by carrying out cross-correlation. However, it is advisable to tap the target current signal before the converting device, so that it can be guaranteed that the target current signal is compared to an actual current signal and not to an interference signal that is possibly caused by crosstalk between different lines.

As described in detail above, there are various possibilities for designing and further developing the method according to the invention for operating a field device or the field device according to the invention. Reference is made to the following description of embodiments in conjunction with the accompanying drawings.

DETAILED DESCRIPTION OF THE INVENTION

Figure 1:
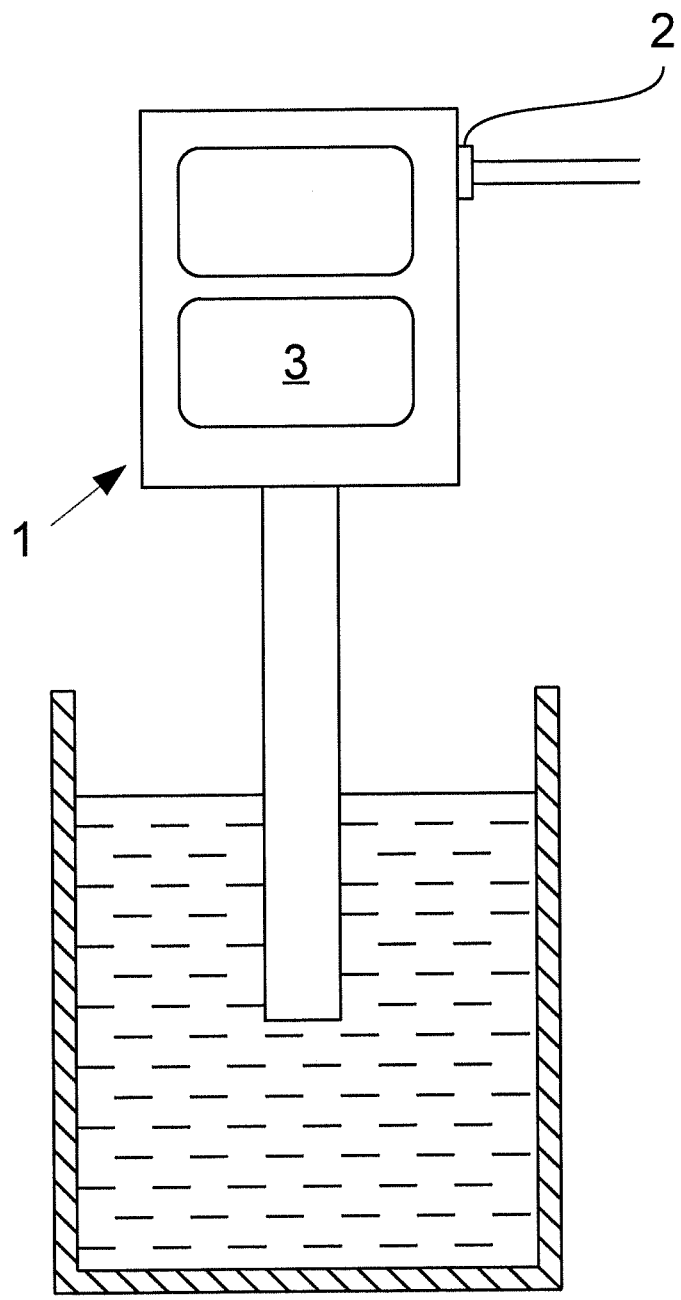
FIG. 1 is a schematic representation of an embodiment of the field device.

FIG. 1 shows a field device 1 with a signal outlet 2 and a control component 3 located in the field device 1. The field device 1 shown in FIG. 1 is a temperature measuring device with a temperature sensor, which is arranged in a container with a medium whose temperature is to be determined. Current signals containing information about the measured value are issued via the signal outlet 2. Issued signals are fed back by the field device 1, so that a target current signal can be compared to an actual current signal. The control component 3 is used for the comparison of the signals, which reacts to deviations that are too large. This can be different from target current signal to actual current signal depending on the size of the deviation. In the case of small deviations, the current set point is adapted by the control component 3. In the case of higher deviations, the control component 3 issues an acoustic and visually perceptible signal that prompts the user to react, be it carrying out repairs or exchanging the field device 1.

Figure 2:
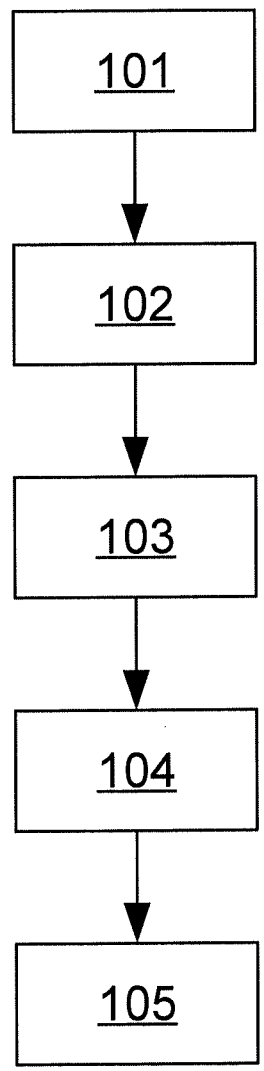
FIG. 2 is a flow diagram of a method for operating a field device.

FIG. 2 shows the schematic sequence for a design of the method for operating a field device. In step 101, a measured value is generated by the field device. This can be, for example, a velocity measurement or other measurement of physical and/or chemical states. The measured value is then assigned a current set point according to the known 4 . . . 20 mA standard according to DIN IEC 60381-1 in step 102, which is then issued as target current signal in step 103. The signal outlet is designed as an analog current outlet. In step 104, an actual current signal is fed back by the signal outlet and is compared to the target current signal in step 105. Steps 102 and 105 are coordinated and carried out by the control component of the field device.

The signals are digitized with the same sampling rate in order to simplify comparability on a digital level. In the comparison of the target current signal to the actual current signal, cross-correlation of the target current signal with the actual current signal is carried out by the control component. Without having to carry out further calculations, a deviation of the actual current signal from the target current signal can be calculated as absolute error solely from the cross-correlation.

However, a relative error is determined in this embodiment. For this, the control component calculates an auto-correlation of the target current signal and puts the results of the cross-correlation in relation to the results of the auto-correlation in order to determine a deviation.

Figure 3:
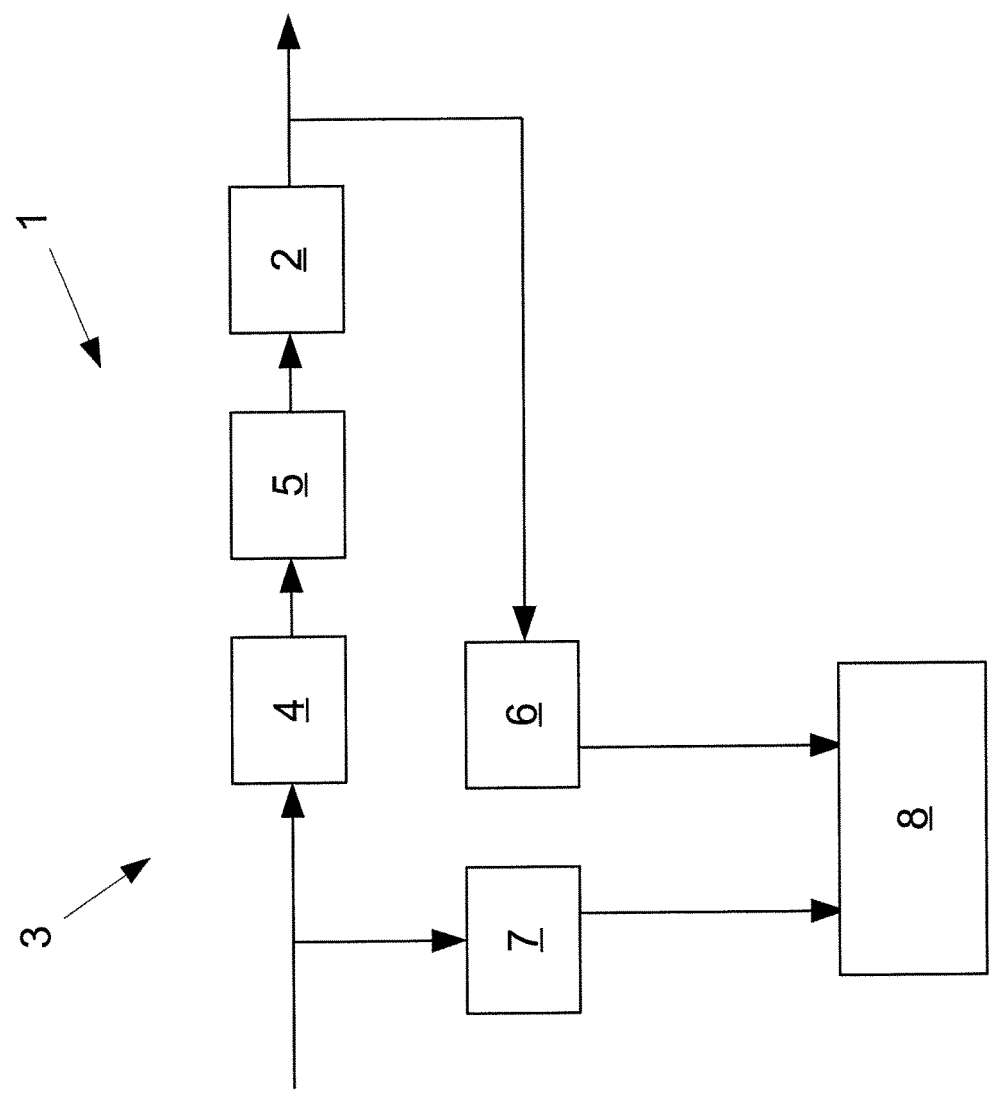
FIG. 3 a block diagram of the construction of an embodiment of the field device.

The schematic construction of a field device 1 for carrying out the method according to FIG. 2 is shown in FIG. 3. In this embodiment, the field device 1 comprises a converting device 4, which, after the generation of the target current signal, converts the digital target control signal into an analog signal. The converting device 4 is downstream to an analog filter 5. This analog filter 5, a low pass filter here, has a cutoff frequency of 25 Hz.

The filtered signal is then issued via the signal outlet 2 and is subsequently fed back. The signal is digitized with an analog-digital converter 6 while being fed back in order to allow an easier evaluation or an easier comparison to the target current signal.

In order for the signals to be more easily compared to one another, a digital replication 7 of the analog filter 5, or low-pass filter, is provided, which filters the set target current signal. The target current signal is tapped before the converting device 4. Both signals, the digital filtered target current signal as well as the actual current signal that has been fed back, are them compared to one another by the control component 3 by calculating the cross-correlation, wherein it is supplied to a calculating unit 8.

What is claimed is:

1. A method for operating a field device, comprising:
   generating a measured value,
   assigning electrical current set point to the measured value,
   issuing a target electrical current signal depending on the electrical current set point, and
   feeding back an actual electrical current signal and comparing the target electrical current signal to the actual electrical current signal,
   wherein a cross-correlation of a digital version of the target electrical current signal with a digital version of the actual electrical current signal is formed for the comparison to compensate for time lags between the target electrical current signal and the actual electrical current signal caused by respective filtering and/or conversions of the actual electrical current signal in the target electrical current signal, and
   wherein, when the target electrical current signal is found to deviate from the actual electrical current signal by an amount above a set level, an alarm signal is issued that prompts a user to react for carrying out repairs or exchange of the field device.

2. The method according to claim 1, wherein an auto-correlation of one of the target current signal and of the actual current signal is formed, and wherein a deviation of the correlated signals is calculated in that the values of the cross-correlation of the actual current signal with the target current signal are related to the value of the auto-correlation of said one of the current set point and of the auto-correlation of the actual current signal.

3. The method according to claim 1, wherein the target current signal is digitized with a first sampling rate and the actual current signal is digitized with a second sampling rate that is set at a fixed relation to the first sampling rate.

4. A field device, comprising:
   at least one signal outlet and
   at least one control component which generates a measured value and assigns a current set point to the measured value, generates a target current signal depending on the current set point and issues the target current signal via the signal outlet and wherein the control component imports an actual current signal and compares a digital version of the target current signal to a digital version of the actual current signal, the control component forming a cross-correlation of the target current signal with the actual current signal for comparison to compensate for time lags between the target current signal and the actual current signal caused by respective filtering and/or conversions of the actual current signal and the target current signal, and wherein, in response to the target electrical current signal being found to deviate from the actual electrical current signal by an amount above a set level, said at least one control component is adapted to cause an alarm signal to be issued that prompts a user to react for carrying out repairs or exchange of the field device.

5. The field device according to claim 4, wherein a converting device is provided for conversion of digital signals to analog signals.

6. The field device according to claim 5, wherein an analog filter is connected behind the converting device.

7. The field device according to claim 6, wherein the analog filter is a low pass filter having a cutoff frequency less than or equal to 25 Hz.

8. The field device according to claim 5, wherein a digital filter is provided for filtering the target current signal.

9. The field device according to claim 4, wherein an analog-digital converter is provided that digitizes the imported actual current signal.

10. The field device according to claim 4, wherein the field device is temperature measuring device with a temperature sensor.

11. The method of claim 1, where a temperature measuring device with a temperature sensor is used for generating said measured value.

* * * * *